(12) United States Patent
Murnane

(10) Patent No.: US 11,936,222 B2
(45) Date of Patent: Mar. 19, 2024

(54) BMS ARCHITECTURE FOR ENERGY STORAGE

(71) Applicant: Analog Devices International Unlimited Company, Limerick (IE)

(72) Inventor: Martin Murnane, Limerick (IE)

(73) Assignee: Analog Devices International Unlimited Company, Limerick (IE)

( * ) Notice: Subject to any disclaimer, the term of this patent is extended or adjusted under 35 U.S.C. 154(b) by 284 days.

(21) Appl. No.: 17/240,350

(22) Filed: Apr. 26, 2021

(65) Prior Publication Data

US 2021/0376626 A1 Dec. 2, 2021

Related U.S. Application Data

(60) Provisional application No. 63/030,050, filed on May 26, 2020.

(51) Int. Cl.
*H01M 10/44* (2006.01)
*G01R 31/371* (2019.01)
*G01R 31/3835* (2019.01)
*G01R 31/396* (2019.01)
*H01M 10/46* (2006.01)
*H02J 7/00* (2006.01)

(52) U.S. Cl.
CPC .......... *H02J 7/0031* (2013.01); *G01R 31/371* (2019.01); *G01R 31/3835* (2019.01); *G01R 31/396* (2019.01); *H02J 7/00032* (2020.01); *H02J 7/00308* (2020.01); *H02J 7/0047* (2013.01)

(58) Field of Classification Search
CPC .. H02J 7/00032; H02J 7/0031; H02J 7/00308; H02J 7/0029; H02J 7/00302; H02J 7/0047; H02J 7/0016; G01R 31/396; G01R 31/371; G01R 31/3831; G01R 31/3835
USPC ........ 320/107, 116, 118, 119, 122, 132, 134, 320/136, DIG. 19
See application file for complete search history.

(56) References Cited

U.S. PATENT DOCUMENTS

| | | | |
|---|---|---|---|
| 9,912,017 B1 * | 3/2018 | Kuo | .................... H01M 10/425 |
| 2012/0105001 A1 | 5/2012 | Gallegos et al. | |
| 2014/0347014 A1 | 11/2014 | Lee et al. | |
| 2016/0075254 A1 | 3/2016 | Chang et al. | |
| 2017/0077558 A1 | 3/2017 | Nystrom et al. | |

OTHER PUBLICATIONS

"European Application Serial No. 21174998.1, Extended European Search Report dated Nov. 3, 2021", 8 pgs.
"European Application Serial No. 21174998.1, Communication Pursuant to Article 94(3) EPC dated Jun. 23, 2022", 5 pgs.

* cited by examiner

*Primary Examiner* — Edward Tso
(74) *Attorney, Agent, or Firm* — Schwegman Lundberg & Woessner, P.A.

(57) ABSTRACT

Embodiments of the present invention provide improved fault detection and mitigation systems, methods, and techniques used in a BMS in an energy storage system (for example, grid energy storage). Embodiments of the present invention may detect battery malfunction in a battery stack and take quick corrective and preventative measures accordingly. Embodiments of the present invention may also provide select redundant components to implement safety techniques described herein.

17 Claims, 8 Drawing Sheets

BMS ARCHITECTURE FOR ENERGY STORAGE

CLAIMS OF PRIORITY

This patent application claims the benefit of priority U.S. Provisional Patent Application Ser. No. 63/030,050, titled "BMS ARCHITECTURE FOR ENERGY STORAGE," filed on May 26, 2020, which is hereby incorporated by reference herein in its entirety.

TECHNICAL FIELD

The present disclosure generally relates to safety techniques and mechanisms for a Battery Management System (BMS) in energy storage applications.

BACKGROUND

With the rapidly evolving technology of smart grid and electric vehicles, the rechargeable battery has emerged as a prominent energy storage device at scale. A BMS monitors rechargeable batteries, such as providing useful data to control systems. BMSs can have a variety of applications ranging from grid energy storage to electric vehicles to other consumer products like e-bikes, e-scooters, and so forth.

Grid energy storage, as the name implies, includes batteries (e.g., Lithium-ion type batteries) that can be coupled to power grid infrastructure, such as providing mass energy storage in distributed manner. These grid energy storage systems can be used in various environments, such as cell phone towers, A/C power substations, Internet infrastructure equipment, aviation ground support systems, tower communications, data centers, residential installations, and so forth. Data centers include network-attached storage accommodating digital data used by a host of industries, such as financial services, health services, etc. Grid energy storage can provide energy using rechargeable batteries in a sustainable and efficient manner, such as providing site power backup when mains power is interrupted, and providing peaking capability for the grid itself when the grid energy storage is not needed locally on-site. Moreover, grid energy storage can be powered by renewable energy devices.

Rechargeable batteries, being electrochemical in nature, may exhibit a variety of undesirable operational characteristics such as outgassing, leakage of electrolyte, or thermal issues such as overheating or exothermically reacting with oxygen.

BRIEF DESCRIPTION OF THE DRAWINGS

Various ones of the appended drawings merely illustrate example embodiments of the present disclosure and should not be considered as limiting its scope.

DETAILED DESCRIPTION

Embodiments of the present invention provide improved fault detection and mitigation systems, methods, and techniques used in a BMS in an energy storage system (for example, grid energy storage). Monitoring provided using apparatus and techniques described herein can facilitate one or more of early detection or mitigation of undesired behaviors such as mentioned above. For example, embodiments of the present invention may detect battery malfunction in a battery stack and take quick corrective and preventative measures accordingly. Embodiments of the present invention may also provide select redundant components to implement fault monitoring or mitigation techniques described herein. The fault monitoring techniques and mechanisms described herein may help enable adoption of grid energy storage to provide a safe, reliable, and cost-efficient energy solution for power-intensive applications, such as data centers.

This document describes a battery monitoring module. The module may include a battery monitoring circuit to measure battery parameters of a plurality of battery cells and to communicate the measured battery parameters to a master controller. The module may also include an external monitor to monitor a voltage level of the battery cells and in response to detection of a failure event based on the monitored voltage level, to disconnect a charging input from the plurality of battery cells.

This document also describes a method to control a battery module. The method may include measuring, by a battery monitoring circuit, parameters of a plurality of battery cells; monitoring, by an external monitor, a voltage level of the plurality of battery cells; and in response to detecting a failure event based on the monitored voltage level, disconnecting a charging input from the plurality of battery cells.

This document further describes a battery management system. The system may include a plurality of battery modules and a master controller communicatively coupled to the plurality of battery modules to receive battery measurement data from the plurality of battery modules. The system may also include a charger coupled to the plurality of battery modules. At least one of the plurality of battery modules may include a battery circuit to monitor battery cells and to transmit the battery measurement data to the master controller and an external monitor to monitor a voltage level of battery cells in the battery module and in response to detection of a failure event based on the monitored voltage level, to disconnect a charging input coupled to the charger.

Figure 1:
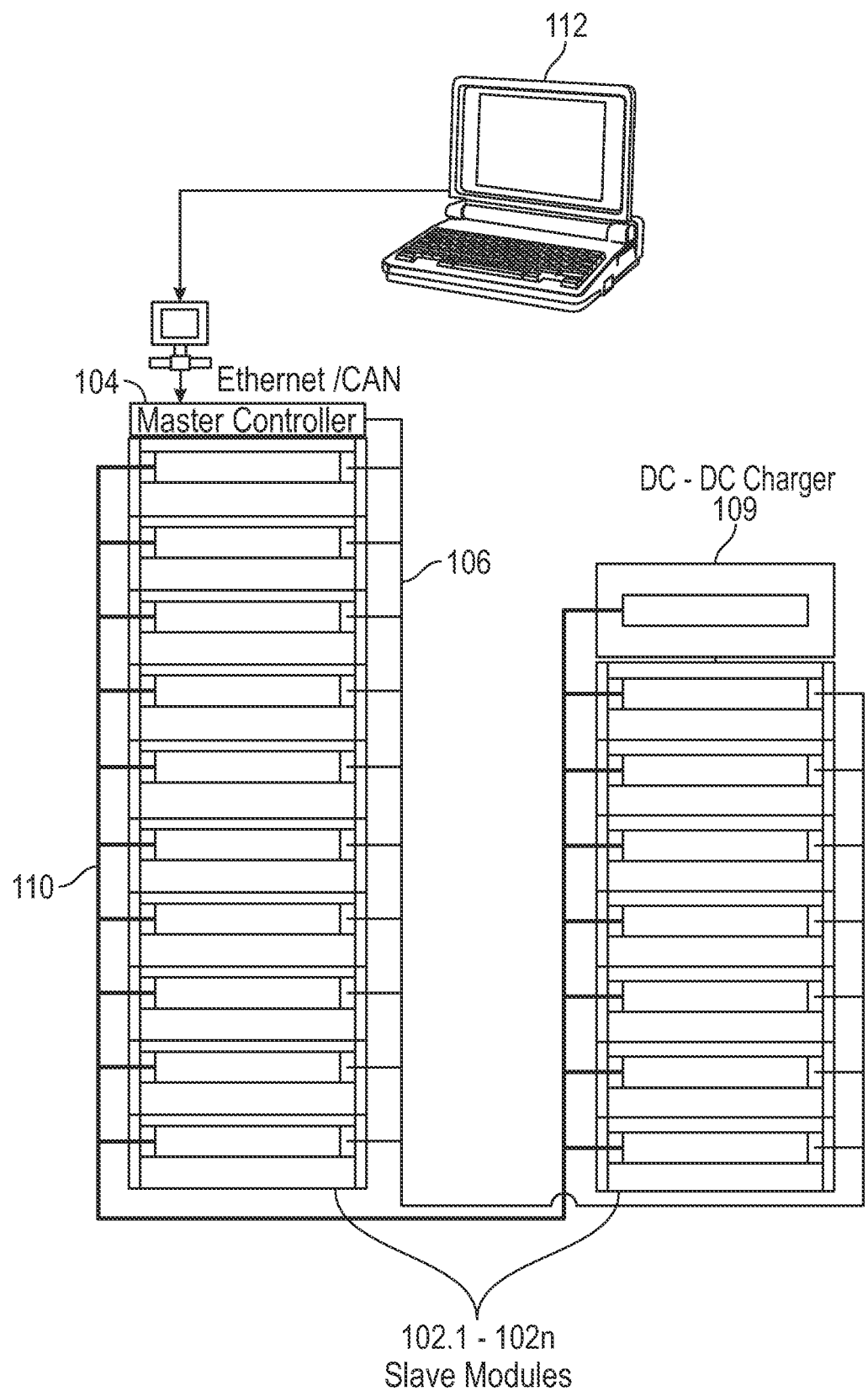
FIG. 1 illustrates an example portion of a BMS.

FIG. 1 illustrates an example of portions a BMS 100 using stacked battery modules. The BMS 100 may include a plurality of slave modules 102.1-102.N, a master controller 104, a communication interface 106, a DC-DC charger 108, cables 110, and a central control unit 112. The slave modules 102.1-102.N may each contain battery cells. Different types of chargeable batteries may be used. For example, the battery cells may be lithium ion batteries. Batteries with different specifications, sizes, and shapes may be used.

As described in further detail below, the slave modules 102.1-102.N may also include battery management hardware to control charging and discharging of the battery cells, to take battery measurements (e.g., voltage, current, temperature), and to manage functional safety aspects relating to the battery cells. The slave modules 102.1-102.N may communicate with the master controller 104 via the communication interface 106. The communication interface 106 may be provided as a wired network, a wireless network, or a combination thereof. For example, the communication interface 106 may include isolated (transformer) communication cabling, such as implementing an Isolated Serial Peripheral Interface (SPI). The communication cabling may be connected in a serial fashion from module to module, e.g., daisy chained from module to module with the last slave module 102.N providing a termination point for the cabling.

The slave modules 102.1-102.N may transmit battery measurements taken of the battery cells therein to the master controller 106. The measurements may be transmitted periodically (e.g., every 100 milliseconds) and/or in response to a request from the master controller 106. The master controller 106 may be provided as a microprocessor, microcontroller, or the like.

The master controller 106 may be communicatively coupled to the central control unit 112 via a communication link. The communication link may be provided by one or more networks, such as the Internet. The network may include a wired or wireless local area network (LAN) and a wide area network (WAN), wireless personal area network (PAN) and other types of networks. Computers may be connected over the Internet, an Intranet, Extranet, Ethernet, or any other system that provides communications. Furthermore, components may communicate through a combination of wired or wireless paths.

The central control unit 112 may receive battery measurement information from the master controller 106. The central control unit 112 may control other operations of the system, such as an energy storage system. The central control unit 112 may be coupled to a plurality of master controllers, with each master controller controlling a different set of slave modules.

The slave modules 102.1-102.N may also be coupled to the DC-DC charger 108 through cables 110. The cables 110 may be provided as high voltage/current cables for power transfer. The DC-DC charger 108 may charge the battery cells in the slave modules 102.1-102.N. The DC-DC charger 108 may be connected to the slave modules 102.1-102.N in a serial fashion from module to module, e.g., daisy chained from module to module.

The slave modules 102.1-102.N may be stacked in series and be designed with a target voltage for the stack. For example, the target voltage may be compatible with solar or other renewable energy systems (e.g., 1400-1600 VDC). Hence, the energy storage system with the BMS 100 may be compatible with renewable energy systems.

Figure 2:
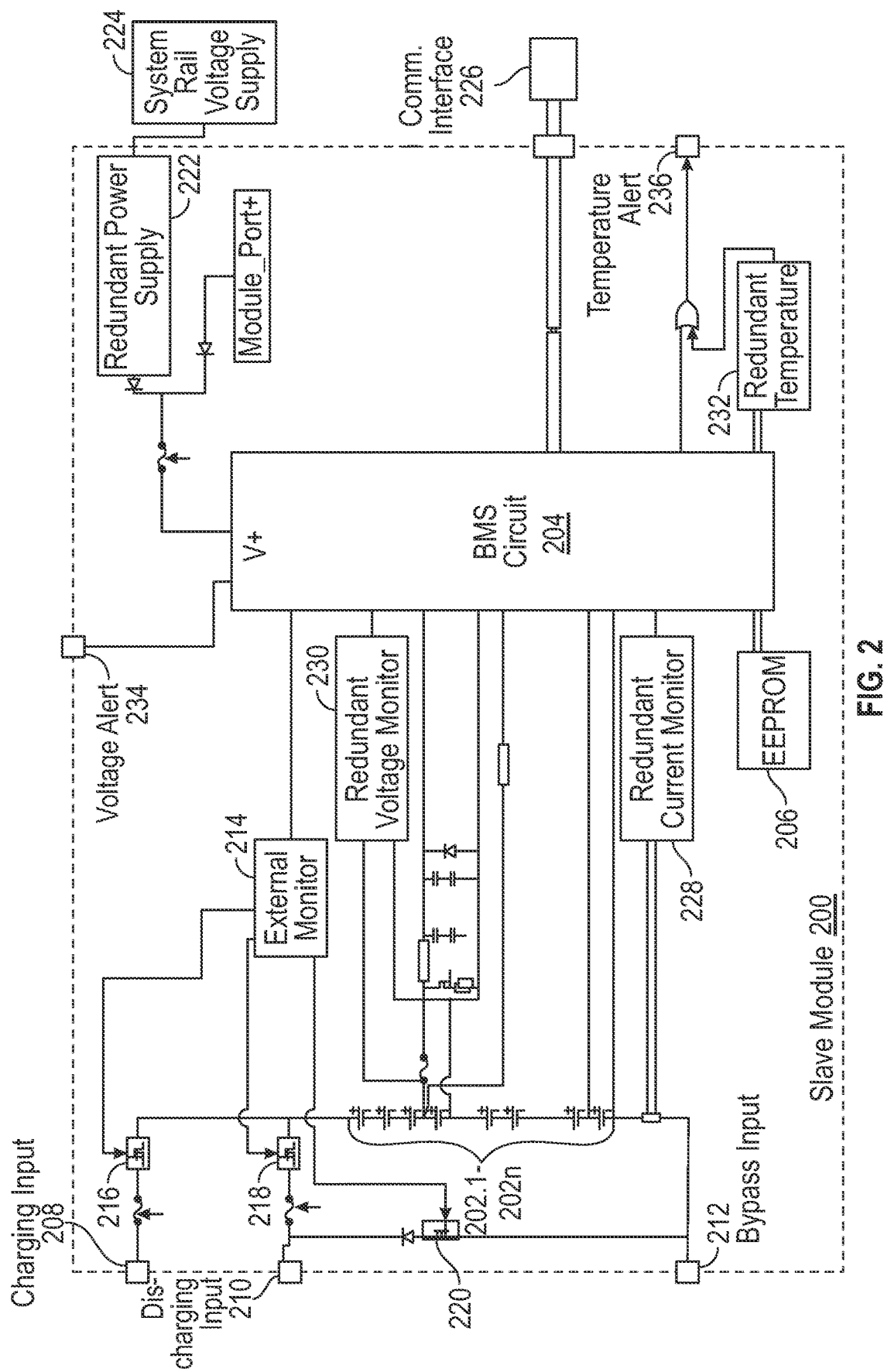
FIG. 2 illustrates an example portion of slave module.

FIG. 2 illustrates a block diagram of a slave module 200. The slave module 200 may include a plurality of battery cells 202.-202.N, a BMS circuit (e.g., an integrated circuit device package such as including a monolithic integrated circuit or multiple circuits) 204, an EEPROM 206, a charging input 208, a discharging input 210, a bypass input 212, an external monitor 214, a safety charging switch 216, a safety discharging switch 218, a safety bypass switch 220, a redundant power supply 222 coupled to a system rail voltage supply 224, a communication interface 226, a redundant current monitor 228, a redundant voltage monitor 230, a redundant temperature monitor 232, a voltage alert 234, and a temperature alert 236.

The plurality of battery cells 202.1-202.N may be charged using the charging input 208, which in turn may be coupled to a charger (e.g., DC-DC charger 108). A fuse may also be provided to limit the charging current to a certain level (e.g., below 15 A). The battery cells 202.1-202.N may be discharged using the discharging input 210. A fuse may be also provided to limit the discharging current to a certain level (e.g., below 120 A). The discharging rate may be greater than the charging rate. For example, higher discharge rates may support powering data center servers.

The battery cells 202.1-202.N may generate a voltage, Module_Prot+. The Module_Prot+ voltage may be supplied to the BMS circuit 204 through a V+ input to power the BMS circuit 204 in normal operations.

The battery cells 202.1-202.N may be monitored by the BMS circuit 204. The BMS circuit 204 may include hardware and software to measure voltage, current, and/or temperature levels of the battery cells 202.202.N. The BMS circuit 204 may store those measurements values in the EEPROM 206. The BMS circuit 204 may also communicate those measurements to a master controller (e.g., 104) via the communication interface 226. Details of example embodiments of the communication interface 226 are described below.

The slave module 200 may include safety components to detect battery malfunctions. The slave module 200 may include an external monitor 214. The external monitor 214 may detect over and under voltages of the battery cells 202.1-202.N. For example, the external monitor may monitor the voltage at the V+pin of the BMS circuit 204, which may include the Module Prot+voltage during normal operations. The external monitor 214 may provide quick safety protocols in response to detection of over or under voltage conditions. The external monitor 214 may be coupled to and control the safety charging switch 216, (with or without isolated drivers) the safety discharging switch 218, and the safety bypass switch 220. The safety switches 216-220 may be provided as MOSFET switches and may be turned on/off by controlling their respective gate voltage, through an isolated or non-isolated gate driver if needed. In response to detection of an over and under voltage condition, the external monitor 214 may turn on/off the relevant safety switch (es), as explained in further detail below. In an example, a separate external monitor 214 may be provided for each of the safety charging switch 216, the safety discharging switch 218, and the safety bypass switch 220.

The slave module 200 may include a redundant power supply 222 coupled to a system rail voltage supply 224 to provide power to the BMS circuit 204 when the battery cells 202.1-202.N malfunction and cannot provide the Module_Part+ voltage to power the BMS circuit 204. The redundant power supply 222 may be coupled to V+ pin of the BMS circuit 204, the same pin where the Module_Part+ voltage from the battery cells 202.1-202.N is supplied. Hence, the BMS circuit 204 may be provided with continuous power even when Module_Part+ voltage from the battery cells 202.1-202.N goes low. Consequently, in the event of a battery failure, the BMS circuit 204 may use the power from the redundant power supply 222 to continue battery measurements (e.g., voltage and temperature) for safety monitoring and engage safety mechanisms, such as turning on a cooling fan, opening a vent to release gases from the battery, switching on a gas detection circuit, turning on a sprinkler system, and so forth.

The slave module 200 may also include other redundant components to provide more robust operations of the slave module. The slave module 200 may include a redundant current monitor 228, a redundant voltage monitor 230, and a redundant temperature monitor 232. For example, the redundant current monitor 228 may independently monitor the charging current of the battery cells 202.1-202.N, e.g., without using the BMS circuit 204. The charging current of a battery cell may have an impact on the life of the battery. The measured charging current data may be sent to the master controller, which may monitor the charging current and the charging/discharging rate of the battery cells 202.1-202.N. The master controller may then instruct the slave module 200 to adjust the charging current accordingly to extend the life of the battery. The redundant voltage monitor 230 may independently detect over and under voltages from the battery cells 202.1-202.N. And the redundant temperature monitor 232 may independently monitor temperature levels.

The slave module may also include external voltage and temperature alerts 234, 236. For example, in the event of an over or under voltage condition as detected by the external monitor 214, the slave module 200 may send an alert directly to the master controller via the voltage alert 234. Likewise, in the event of an overheating condition as detected by the BMS circuit 204 and/or the redundant temperature monitor 232, the slave module 200 may send an alert directly to the master controller via temperature alert 236. Also, the external monitor may send the alerts to external contactors to open them directly, eliminating master controller latency.

Figure 3:
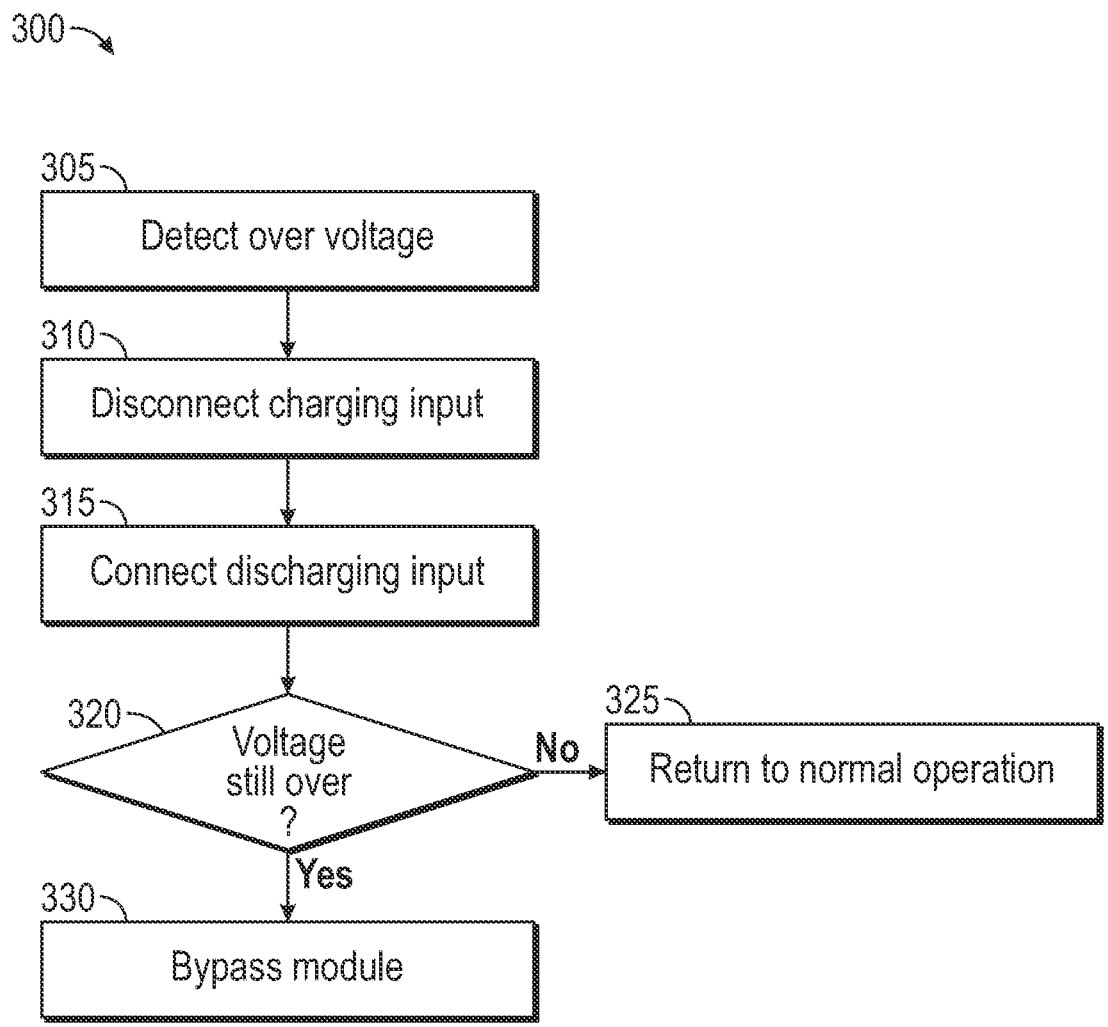
FIG. 3 is a flow diagram for operations during an over voltage condition.

Next, operations of the slave module 200 during over and under voltages are described. FIG. 3 illustrates a flow diagram for a method 300 for operating during an over voltage condition. At step 305, an over voltage condition may be detected. For example, the external monitor 214 may detect an over voltage at the V+ pin, where the Module_Prot+ is supplied. The external monitor 314 may utilize an over voltage threshold to detect an over voltage condition. For example, when the Module_Prot+ voltage exceeds the over voltage threshold, an over voltage condition may be detected.

At step 310, in response to detecting an over voltage condition, battery cells 202.1-202.N may be disconnected from the charging input 208. For example, the external monitor 214 may turn off safety charging switch 216 to disconnect the charging input 208 from the battery cells 202.1-202.N.

At step 315, the battery cells 202.1-202.N may be connected to the discharging input 210 so that the battery cell voltage may be discharged to reduce the voltage level. For example, the external monitor 214 may turn on the safety discharging switch 218 to connect the discharging input 210 to battery cells 202.1-202.N.

At step 320, the external monitor 214 may detect whether the over voltage condition is still occurring. At step 325, if the voltage has been reduced to below the over voltage threshold, the slave module 200 may return to normal operation.

However, if the voltage has not been reduced and over voltage condition persists, the slave module 200 may be bypassed at step 330. For example, the external monitor 214 may turn on the safety bypass switch 220 so that the slave module 200 is bypassed in the battery stack. This way, the neighboring slave modules may continue their respective operations and may bypass slave module 200.

Figure 4:
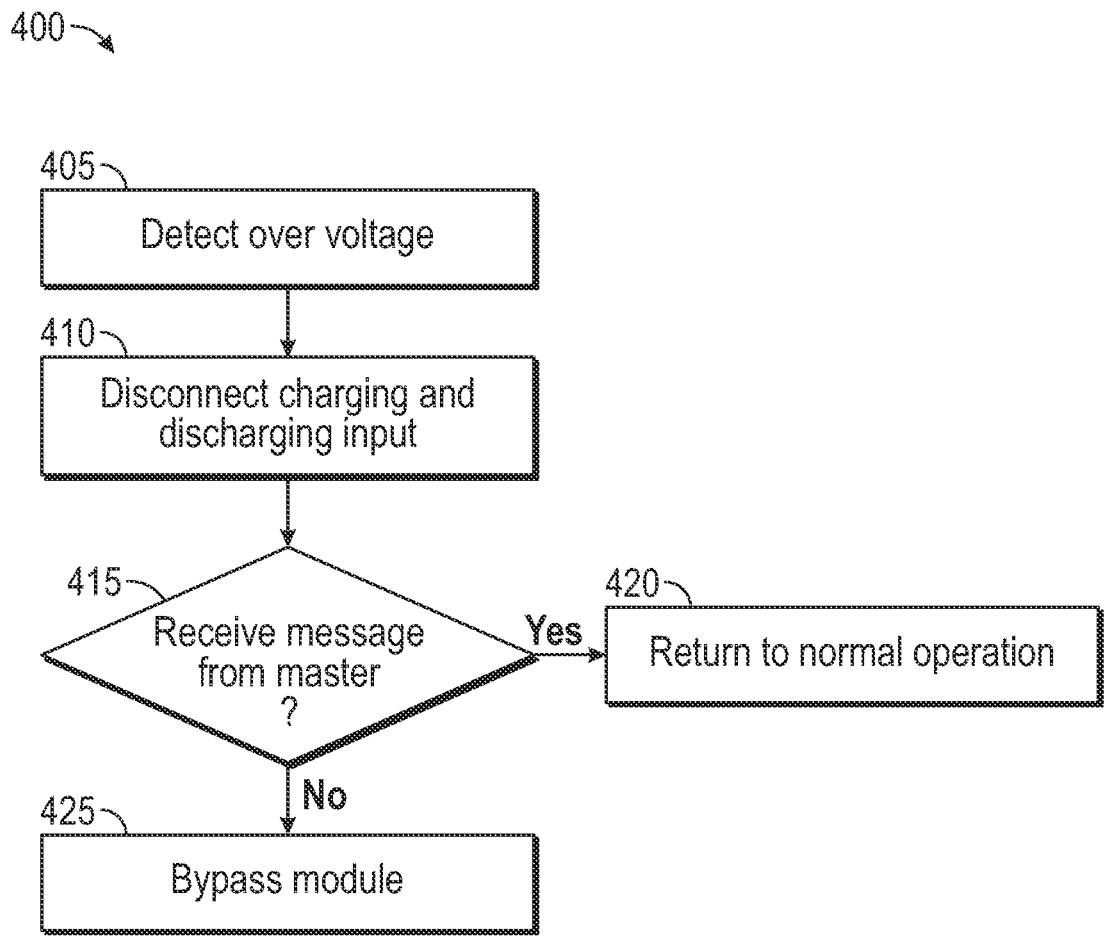
FIG. 4 is a flow diagram for operations during an under voltage condition.

FIG. 4 illustrates a flow diagram for a method 400 to operate during an under voltage condition. At step 405, an under voltage condition may be detected. For example, the external monitor 314 may detect an under voltage at the V+ pin, where the Module_Prot+ is supplied. The external monitor 314 may utilize an under voltage threshold to detect an over voltage condition. For example, when the Module_Prot+ voltage goes below the over voltage threshold, an under voltage condition may be detected.

At step 410, in response to detecting an under voltage condition, battery cells 202.1-202.N may be disconnected from the charging input 208 and the discharging input 210. Even though the battery cells 202.1-202.N may be below a desired voltage, the charging input may be still disconnected for safety reasons. For example, if the battery cells (e.g., lithium ion battery cells) have entered a deep discharge, recharging them can cause a fire. The external monitor 214 may turn off the safety charging switch 216 and the safety discharging switch 218 to disconnect the charging input 208 and the discharging input 210, respectively, from the battery cells 202.1-202.N.

The BMS circuit 204 may continue its battery monitoring (e.g., voltage), by using the redundant power supply 222 for example, and may continue sending those measurements to the master controller. The master controller may monitor the battery cells to determine if the cells have gone into deep discharge. If master controller determines that no fault exits and that the operation of the battery cells may be resumed, it may send a message to resume operations; that message from the master controller may be received by the slave module at step 415. If such a message is received, the slave module 200 may return to normal operation.

However, if no such message is received from the master controller, the slave module may assume a fault exists with the battery cells (e.g., deep discharge) and the slave module 200 may be bypassed at step 425. For example, the external monitor 214 may turn on the safety bypass switch 220 so that the slave module 200 is bypassed in the battery stack. This way, the neighboring slave modules may continue their respective operations and may bypass slave module 200.

Figure 5:
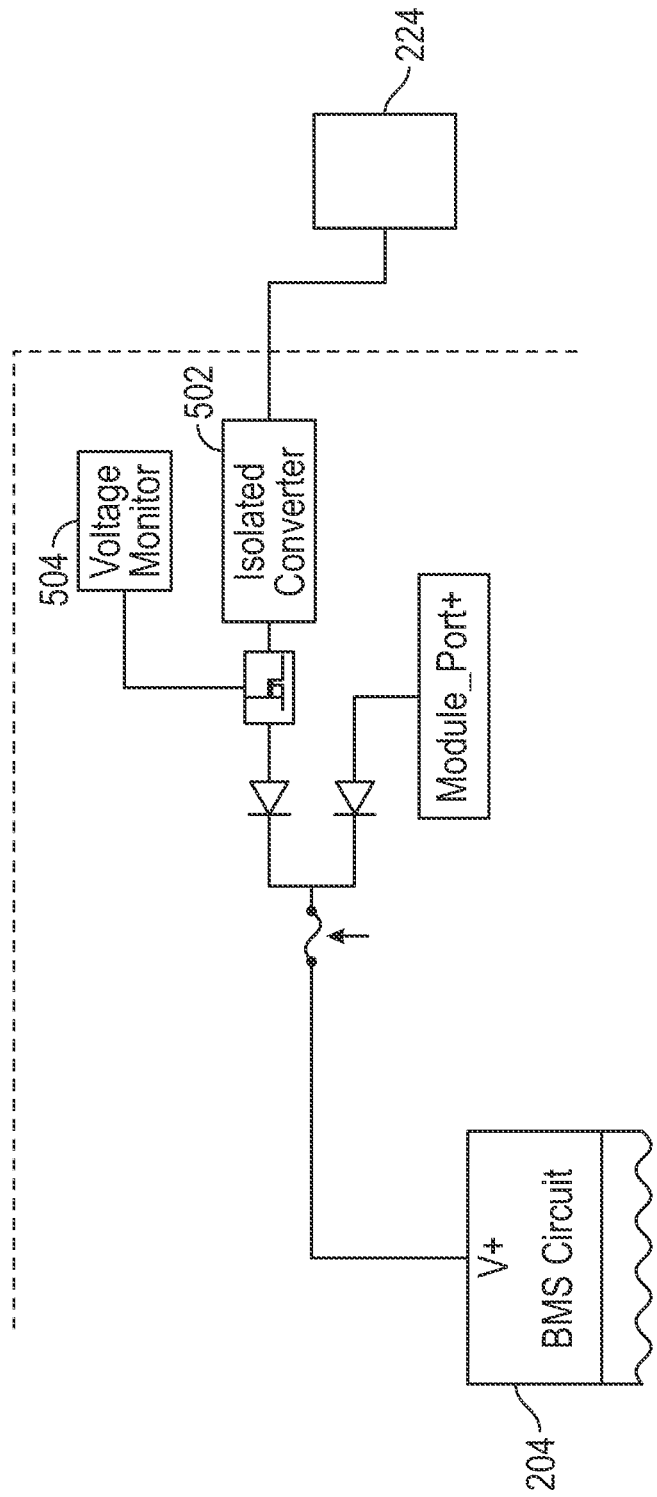
FIG. 5 illustrates an example portion of a redundant power supply.

FIG. 5 illustrates an example of portions a redundant power supply. The redundant power supply may include an isolated converter 502 and a voltage monitor 504. The isolated converter 502 may be coupled to the system rail voltage supply 224 (as described above with reference to FIG. 2). The isolated converter 502 may convert the system rail voltage (e.g., 24V) to a voltage level for operating the BMS circuit 204 (e.g., 50V) and may be coupled to the V+ pin of the BMS circuit 204. A fuse may also be provided to limit the input voltage to the BMS circuit 204 to a certain level (e.g., below 50V). The voltage monitor 504 may monitor the voltage generated by the isolated converter 502.

As described above, during normal operation, the BMS circuit 204 may be powered by the battery cells disposed in the slave module, as represented by Module_Prot+ voltage coupled to the V+ pin of the BMS circuit 204. However, during times where Module_Prot+ goes low (e.g., battery malfunction), the BMS circuit 204 may not lose power as the voltage from the isolated power converter 502 may power the BMS circuit 204. Consequently, in the event of a battery failure, the BMS circuit 204 may use the power from the redundant power supply to continue battery measurements (e.g., voltage and temperature) for safety monitoring and engage safety mechanisms, such as turning on a cooling fan, opening a vent to release gases from the battery, switching on a gas detection circuit, turning on a sprinkler system, and so forth.

Figure 6:
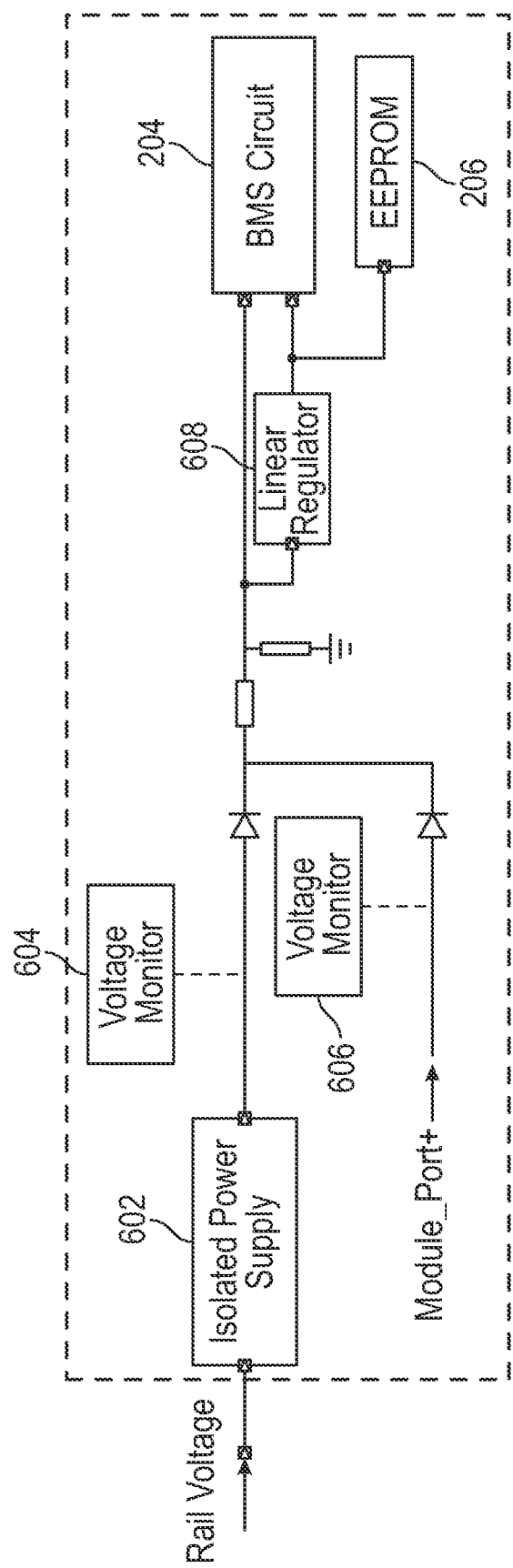
FIG. 6 illustrates another example portion of a redundant power supply.

FIG. 6 illustrates another example of portions a redundant power supply. The redundant power supply may include an isolated power supply 602, voltage monitors 604 and 606, and a linear regulator 608. The isolated power supply 602 may be coupled to the system rail voltage supply 224 (as described above with reference to FIG. 2). The isolated converter 602 may convert the system rail voltage (e.g., 24V) to a voltage level for operating the BMS circuit 204 (e.g., 50V) and may be coupled to the V+ pin of the BMS circuit 204. A fuse may also be provided to limit the input voltage to the BMS circuit 204 to a certain level (e.g., below 50V). The voltage monitor 604 may monitor the voltage generated by the isolated power supply 602.

As described above, during normal operation, the BMS circuit 204 may be powered by the battery cells disposed in the slave module, as represented by Module_Prot voltage coupled to the V+ pin of the BMS circuit 204. However, during times where Module_Prot+ goes low (e.g., battery malfunction), the BMS circuit 204 may not lose power as the voltage from the isolated power supply 602 may power the BMS circuit 204. Consequently, in the event of a battery failure, the BMS circuit 204 may use the power from the redundant power supply to continue battery measurements (e.g., voltage and temperature) for safety monitoring and engage safety mechanisms, such as turning on a cooling fan, opening a vent to release gases from the battery, switching on a gas detection circuit, turning on a sprinkler system, and so forth.

Moreover, the linear regulator 608 may provide a lower voltage (e.g., 5V) to power other components, such as the EEPROM 206 and VREF in the BMS circuit 204.

Figure 7:
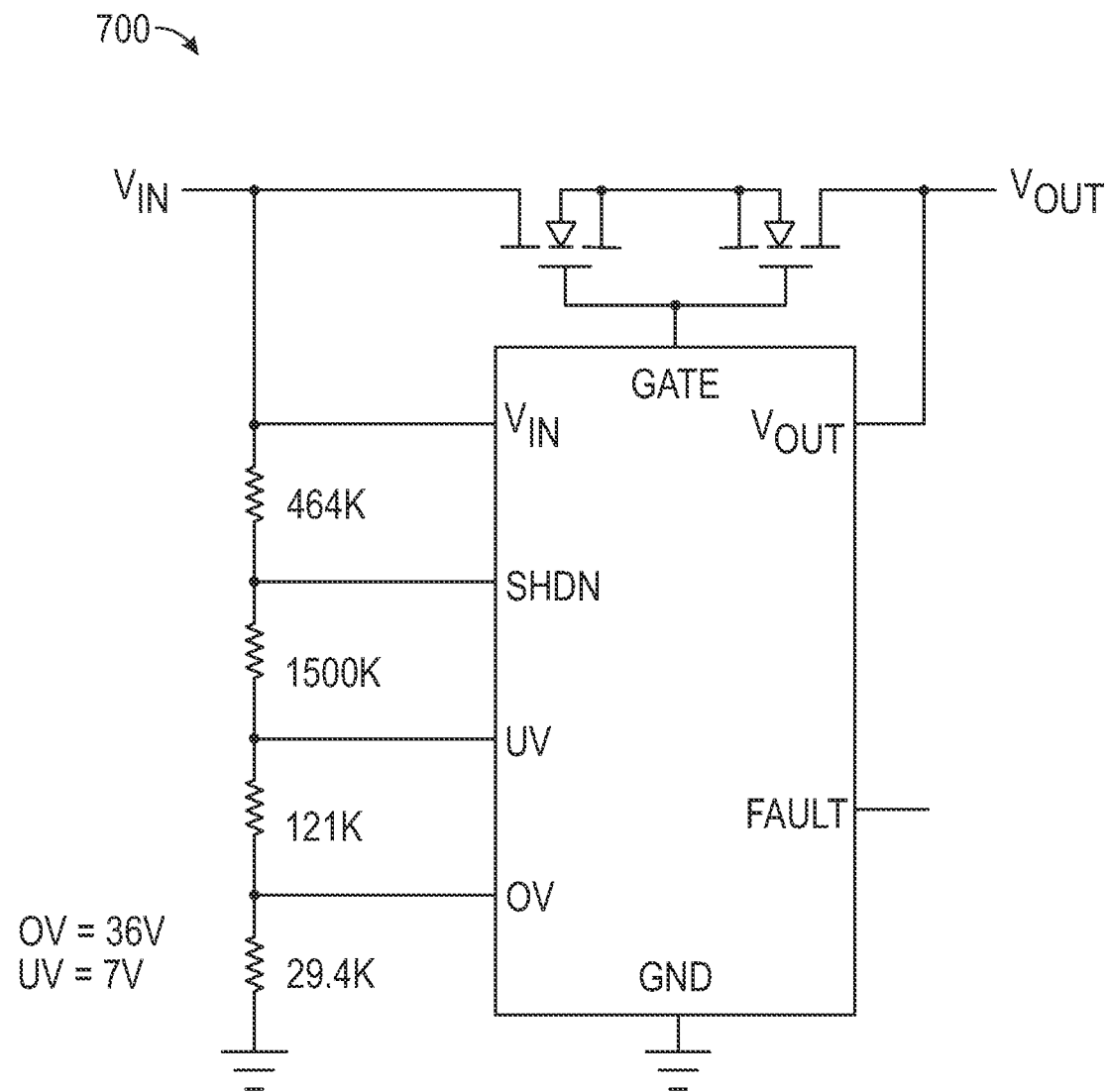
FIG. 7 illustrates an example portion of a monitor.

FIG. 7 illustrates an example of portions a monitor 700. The monitor 700 may be provided as the external monitor 214 of FIG. 2. As such, the monitor 700 may monitor under voltage and over voltage conditions of the V+ input of the BMS circuit 204. The thresholds for under and over voltage may be set by a resistor network. In the example shown in FIG. 7, the over voltage threshold is set at 36V and the under voltage threshold is set by at 7V. In response to detecting an over or under voltage condition, the monitor 700 may generate and transmit control signals to activate safety mechanisms, such as the safety switches as described above with reference to FIG. 2 (e.g., the safety charging switch 216, the safety discharging switch 218, the safety bypass switch 220).

Furthermore, the monitor 700 may also be provided as the voltage monitors described above with FIGS. 5 and 6 (e.g., voltage monitors 504, 604, 606). Here, the monitor 700 may detect voltages in the redundant voltage supply.

Figure 8:
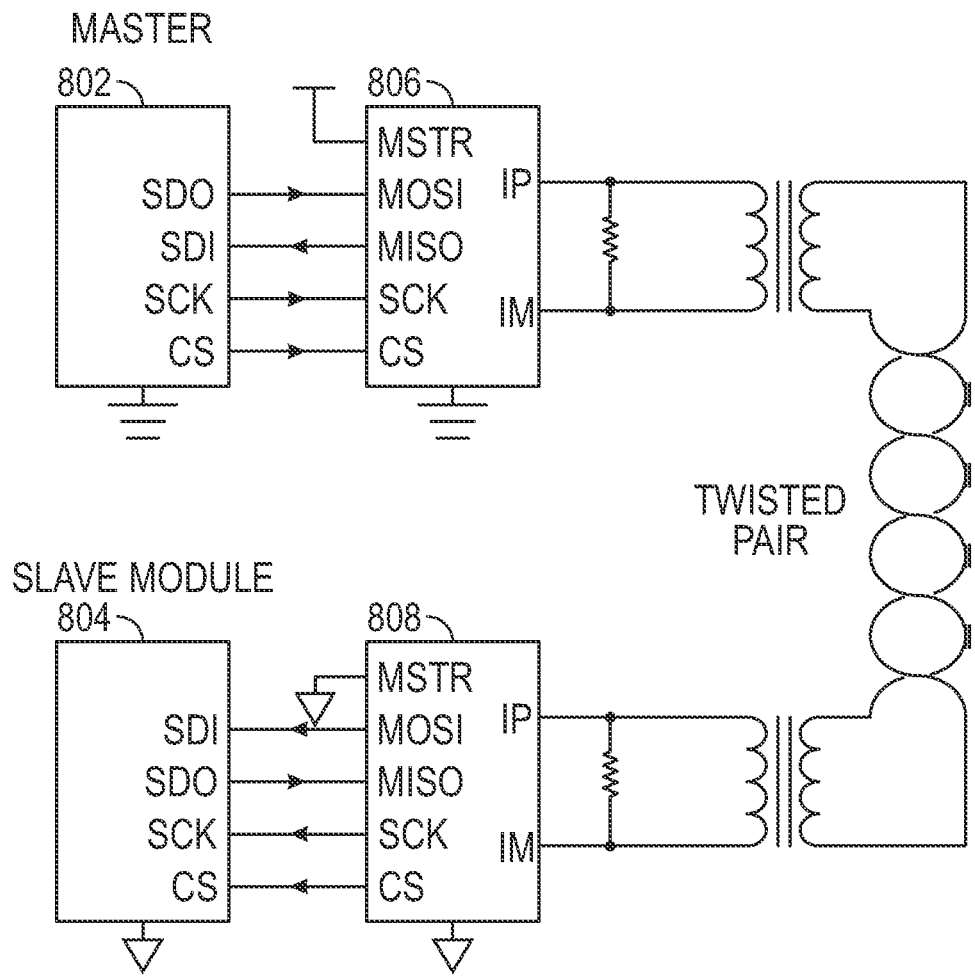
FIG. 8 illustrates an example portion of a communication interface.

FIG. 8 illustrates an example of portions of a communication interface between a master microcontroller 802 and a slave module 804. The microcontroller 802 and slave module 804 may be coupled to translator circuits 806, 808 to provide an isolated SPI. The translator circuits 806, 808 may include a SPI interface with its four logic lines: Master Output Slave Input (MOSI), Master Input Slave Output (MISO), SCLK, and Chip Select (CS). The translator circuits may convert the SPI lines to an Isolated SPI with a differential pair of wires (IP, IM). In another example the communication interface may be provided as a wireless network (e.g., mesh network) or a combination of a wired and wireless network.

Several embodiments of the invention are specifically illustrated and/or described herein. However, it will be appreciated that modifications and variations of the invention are covered by the above teachings and within the purview of the appended claims without departing from the intended scope of the invention.

Although the embodiments of the present disclosure have been described with reference to specific example embodiments, it will be evident that various modifications and changes may be made to these embodiments without departing from the broader scope of the inventive subject matter. Accordingly, the specification and drawings are to be regarded in an illustrative rather than a restrictive sense. The accompanying drawings that form a part hereof show, by way of illustration, and not of limitation, specific embodiments in which the subject matter may be practiced. The embodiments illustrated are described in sufficient detail to enable those skilled in the art to practice the teachings disclosed herein. Other embodiments may be used and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

What is claimed is:

1. A battery monitoring module comprising:
   a battery monitoring circuit to measure battery parameters of a plurality of battery cells and to communicate the measured battery parameters to a master controller;
   an external monitor to monitor a voltage level of the battery cells and in response to detection of a failure event based on the monitored voltage level, to disconnect a charging input from the plurality of battery cells, the external monitor being external to the battery monitoring circuit; and
   a redundant power supply to supply power to the battery monitoring circuit at least during the failure event.

2. The battery monitoring module of claim 1, wherein the failure event comprises an over voltage condition, wherein the external monitor configured to connect a discharging input to discharge the battery cells.

3. The battery monitoring module of claim 1, wherein the failure event comprises an under voltage condition, wherein the external monitor configured to disconnect a discharger input from the plurality of battery cells.

4. The battery monitoring module of claim 1, wherein battery monitoring module configured to transmit an alert regarding the failure event.

5. The battery monitoring module of claim 4, wherein the alert is transmitted from the external monitor to the master controller or to an external contactor.

6. The battery monitoring module of claim 1, wherein the battery monitoring circuit configured to transmit measured battery parameters to the master controller during the failure event in response to being powered by the redundant power supply.

7. The battery monitoring module of claim 1, wherein the battery monitoring circuit configured to engage a safety mechanism during the failure event in response to being powered by the redundant power supply.

8. The battery monitoring module of claim 1, wherein the battery monitoring module configured to enable a bypass function to bypass the battery monitoring module in a battery stack.

9. A method to control a battery module, comprising:
   measuring, by a battery monitoring circuit, parameters of a plurality of battery cells;
   monitoring, by an external monitor separate from the battery monitoring circuit, a voltage level of the plurality of battery cells;
   in response to detecting a failure event based on the monitored voltage level, disconnecting a charging input from the plurality of battery cells; and
   supplying power to the battery monitoring circuit during the failure event using a redundant power supply, wherein the battery monitoring circuit is powered by the plurality of battery cells during normal operation mode.

10. The method of claim 9, further comprising:
connecting a discharging input to the plurality of battery cells, wherein the failure event is an over voltage condition;
determining whether the over voltage condition is still present;
in response to determining that the over voltage condition has ended, returning to a normal operation mode; and
in response to determining that the over voltage condition is still present, bypassing the battery module.

11. The method of claim 9, further comprising:
disconnecting a discharging input to the plurality of battery cells, wherein the failure event is an under voltage condition;
determining whether the under voltage condition is still present;
in response to determining that the under voltage condition has ended, returning to a normal operation mode; and
in response to determining that the under voltage condition is still present, bypassing the battery module.

12. The method of claim 11, wherein determining whether the under voltage is still present includes receiving a message from a master controller.

13. The method of claim 9, further comprising:
transmitting an alert regarding the failure event.

14. The method of claim 13, wherein the alert is transmitted by the external monitor to a master controller or to an external contactor.

15. The method of claim 9, further comprising:
transmitting, by the battery monitoring circuit, measured parameters of the plurality of battery cells to a master controller during the failure event in response to being powered by the redundant power supply.

16. The method of claim 9, further comprising:
engaging, by the battery monitor circuit, a safety mechanism during the failure event in response to being powered by the redundant power supply.

17. A battery management system comprising:
a plurality of battery modules;
a master controller communicatively coupled to the plurality of battery modules to receive battery measurement data from the plurality of battery modules; and
a charger coupled to the plurality of battery modules;
wherein at least one of the plurality of battery modules comprising:
a battery monitoring circuit to monitor battery cells and to transmit the battery measurement data to the master controller;
an external monitor separate from the battery monitoring circuit to monitor a voltage level of battery cells in the battery module and in response to detection of a failure event based on the monitored voltage level, to disconnect a charging input coupled to the charger; and
a redundant power supply to supply power to the battery monitoring circuit during the failure event, wherein the battery monitoring circuit is powered by battery cells during normal operations.

* * * * *